Figure 1:
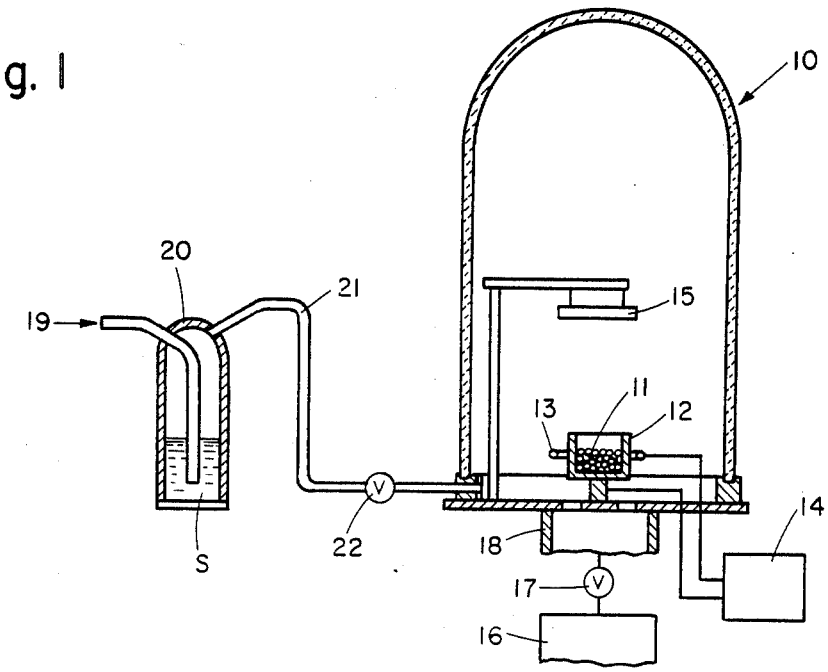

United States Patent [19]

Grain

[11] Patent Number: 4,575,464

[45] Date of Patent: Mar. 11, 1986

[54] METHOD FOR PRODUCING THIN FILMS OF RARE EARTH CHALCOGENIDES

[75] Inventor: Clark F. Grain, Framingham, Mass.

[73] Assignee: Arthur D. Little, Inc., Cambridge, Mass.

[21] Appl. No.: 632,159

[22] Filed: Jul. 18, 1984

[51] Int. Cl.⁴ .............................................. C23C 16/00
[52] U.S. Cl. ..................................... 427/255; 427/87; 427/126.1; 427/126.2; 427/128; 427/162; 427/166; 427/255.2
[58] Field of Search ................... 427/255, 255.2, 166, 427/162, 126.2, 99, 87, 126.1, 128, 314

[56] References Cited

U.S. PATENT DOCUMENTS 3,451,845  6/1969  Schuler ........................... 427/255.2
3,737,345  6/1973  Kudman et al. ................. 427/255

*Primary Examiner*—Sadie L. Childs
*Attorney, Agent, or Firm*—Richard J. Hammond; George W. Dishong

[57] ABSTRACT

A method for producing thin films of chalcogenides of the rare earths characterized by introducing a rare earth metal vapor into an atmosphere not containing oxygen, but containing a gaseous chalcogen as well as hydrogen, at a total pressure about $1 \times 10^{-4}$, giving rise to a reaction which forms a gaseous rare earth chalcogenide. The gaseous rare earth chalcogenide is then deposited as a thin film on a substrate heated to 200° C. to about 400° C.

16 Claims, 2 Drawing Figures

METHOD FOR PRODUCING THIN FILMS OF RARE EARTH CHALCOGENIDES

FIELD OF INVENTION

This invention concerns a method for producing thin films of the chalcogenides of rare earth metals. More particularly, this invention concerns the method for rare earth metal chalcogenides characterized as polycrystalline having large crystallites.

BACKGROUND OF THE INVENTION

The lanthanide group of the rare earths, i.e., those having an atomic number of 57 through 71, have recently attracted attention because of their interesting optical, electrical and magnetic properties. For example, their potential technical application in communications and in data processing machines is well recognized. Depending on the chemical composition of various alloys of the lanthanides, their electrical conductivity can be modified over a wide range. More importantly, these materials are known to undergo dramatic changes in optical properties when subjected to changes in temperature, pressure or magnetic field. Possible applications of such "optical switching" materials range from dense optical information storage devices to switchable filters and components of integrated optical circuitry. The rare earth chalcogenides having these switching properties are denoted as mixed valence, mixed configuration, or fluctuating valence compounds.

The lanthanide metals are typically strongly reactive. Accordingly, the production of their pure tellurides, selenides or sulfides presents certain difficulties. The reaction exotherm of the metal/chalcogen is usually quite violent. Further, contamination with other materials particularly with oxygen is difficult to avoid.

Vapor deposition has played an important role in the preparation of thin film chalcogenide rare earths. Sputtering techniques have found some utility but, when rare earth metals are sputtered into a hydrogen sulfide atmosphere for example, the materials deposited are powders that are nonadherent and chemically unstable, reacting with oxygen readily. Alternatively, when thin film rare earth metals are deposited on an inert substrate and then exposed to deoxygenated hydrogen sulfide at high temperatures, the resulting films are typically contaminated with oxygen and contain little or no rare earth sulfide.

The reactive evaporation of a rare earth in a hydrogen sulfide atmosphere at a low partial pressure followed by deposition on a substrate has also yielded thin film material but the chalcogenide formed is not pure, being a mixture of mono, di and tri chalcogenides.

It is thus an object of this invention to present a method for producing chemically pure chalcogenides of the rare earths. With this method, these compounds can be produced directly in the form of thin films which are particularly useful for a variety of technical applications.

The method for producing thin films of chalcogenides of the rare earths is characterized by introducing a rare earth metal vapor into an atmosphere not containing oxygen, but containing gaseous chalcogens as well as hydrogen, at a total pressure about $1 \times 10^{-4}$ to $9 \times 10^{-4}$, giving rise to a reaction which forms gaseous rare earth chalcogenides. The gaseous rare earth chalcogenide is then deposited as a thin film on a substrate heated to 200° C. to about 400° C.

Further features and advantages of the invented method can be seen from the following description of an embodiment of the present invention.

Referring now to figures of this disclosure, FIG. 1 shows a vaccum chamber 10. The chamber is preferably of glass however, any material inert to hydrogen sulfide such as stainless steel may also be used. A vacuum pump 16 is connected to the exhaust tube 18 of the apparatus via valve 17. The rare earth metal 11 to be vaporized is in a crucible 12 of a high melting material such as molybdenum or tungsten. A resistance heater 13 supports crucible 12 and is used to heat the contents of the crucible, i.e., the rare earth metal 11, up to its vaporization point. The resistance heater 13 is connected to a current source 14. It should be noted that other methods are possible for causing the vaporization of the rare earth metal, e.g., electron bombardment, induction heating, etc. Above crucible 12 is a substrate 15 on to which the rare earth metal chalcogenide is deposited. The substrate must be inert to the corrosive atmosphere in which the rare earth metal chalcogenide vapor is formed as well as be stable to the high temperatures required to effect satisfactory thin film depositions, e.g., 200° C to 400° C. Lower temperatures result in unstable films because of the small crystallite size. Higher temperatures result in mixed chalcogenides being deposited. Glass, quartz, sapphire, or magnesium oxide have proven suitable as such substrates. However, as noted below, the composition of the substrate is not critical. On evaporation of the rare earth metal into the atmosphere of hydrogen and a non-oxgyen containing chalcogen gas, a reaction occurs forming a rare earth chalcogenide in the gaseous form. That gaseous product then deposits on substrate 15 which is located above the evaporation source. The substrate 15 only requirements are that it be chemically inert to the corrosive chalcogen atmosphere and that it be stable at the temperature of the chamber, i.e., from about 200° to about 400° C. As a result of having the substrate heated to this temperature, a single phase thin film solid rare earth chalcogenide deposits. Additionally, because of the temperature, the thin film is in the polycrystalline form, the crystals measuring from about 200 angstroms to about 500 angstroms in size. It is because of these relatively large crystallites, that the rare earth chalcogenide thin film is stable when removed from the chamber, i.e., in oxygen-containing atmospheres such as air. It should be noted that the thickness of the film formed depends on the amount of rare earth evaporated. Typically films are from about 1000 angstroms to about 5000 angstroms in thickness. The tellurides and selenides of the rare earth metals can also be produced in accordance with this method since $H_2Te$ and $H_2Se$, similar to $H_2S$ are gaseous.

A further understanding of the present invention can be had by referring to the following non-limiting Examples. It should be noted that while the rare earth metal is characterized by samarium in the following Examples, any of the rare earth metals can be used to achieve similar results. The term "rare earth" is defined as those rare earth metals known as the lanthanide elements and having atomic numbers of from 57 through 71.

EXAMPLES

In Table 1 the approximate conditions necessary to prepare single phase SmS at various substrate temperatures is presented.

TABLE 1

Conditions Required to Prepare Single Phase SmS Films

| Substrate Temp., °C. | Range $P_{S_2}$, torr | Deposition Rate Å/sec |
|---|---|---|
| 25 | $1.4 \times 10^{-13}$–$(4.1 \times 10^{-7})^a$ | ~20 |
| 200 | $(3.2 \times 10^{-12})^a$–$8.6 \times 10^{-10}$ | ~20 |
| 400 | $1.4 \times 10^{-11}$–$3.8 \times 10^{-11}$ | 5 |

$^a$Estimated

Figure 2:
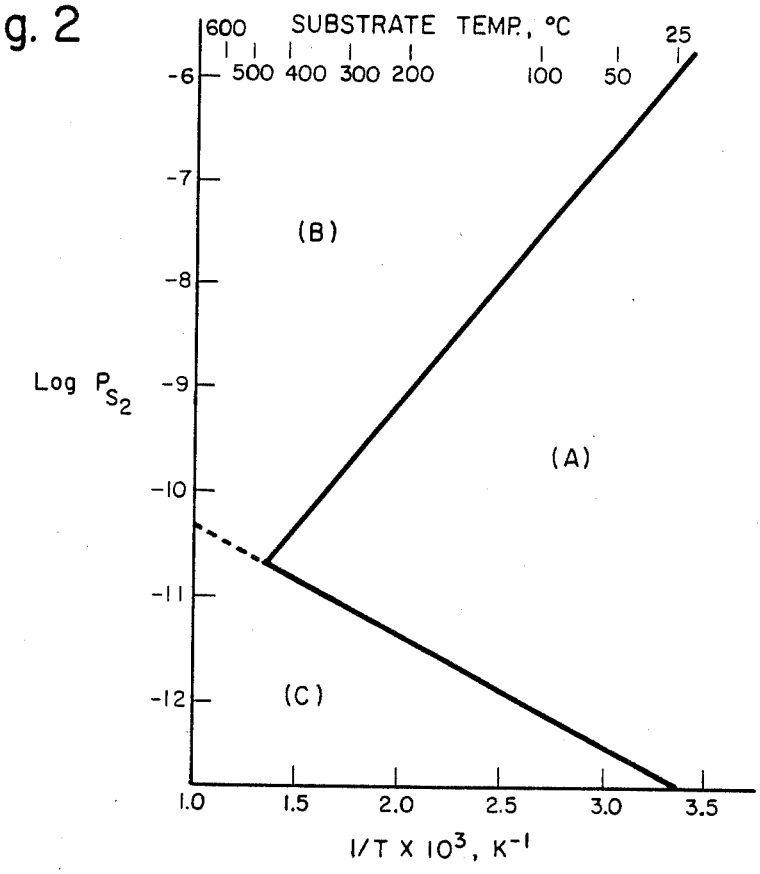

Referring now to FIG. 2, the temperature-pressure relationship of the method of the present invention is shown. The region (A) is the region where samarium sulfide (SmS) film will be obtained whereas regions (B)+(C) will yield impure films ($Sm_2S_3+Sm$).

TABLE 2

(comparison)
Conditions for the Preparation of SmS Films at t = 25° C.

| H$_2$ Pressure, torr | H$_2$S Pressure, torr | $P_{S_2}$, torr | Deposition Rate Å/sec | Phases Obtained |
|---|---|---|---|---|
| 0 | $1 \times 10^{-5}$ | $3 \times 10^{-14}$ | ~20 | Sm |
| 0 | $5 \times 10^{-5}$ | $8 \times 10^{-14}$ | 20 | Sm |
| 0 | $1 \times 10^{-4}$ | $1.4 \times 10^{-13}$ | 20 | SmS |
| 0 | $3.5 \times 10^{-4}$ | $3.2 \times 10^{-13}$ | 20 | SmS |

This Table 2 demonstrates that, when the H$_2$S pressure is controlled such that $P_{S_2}$ is in the range $10^{-13}$ to $10^{-12}$ torr, single phase SmS is formed. However, the stability of the films is such that upon exposure to air, the films rapidly oxidize and a relatively thick layer of oxide is formed. This is because of the very small crystallite size of the SmS films.

TABLE 3

(comparison)
Preparation of SmS Films on Heated Substrates

| Substrate Temp. °C. | $P_{H_2}$, torr | $P_{H_2S}$, torr | $P_{S_2}$, torr | Deposition Rate Å/sec | Phase Present |
|---|---|---|---|---|---|
| 200 | 0 | $10^{-4}$ | $8.6 \times 10^{-10}$ | ~20 | SmS + Sm$_2$S$_3$ |
| 200 | 0 | $3.5 \times 10^{-4}$ | $3.0 \times 10^{-9}$ | 20 | Sm$_2$S$_3$ |
| 400 | 0 | $10^{-4}$ | $7.5 \times 10^{-8}$ | 20 | Sm$_2$S$_3$ |
| 400 | 0 | $3 \times 5 \times 10^{-4}$ | $2.6 \times 10^{-7}$ | 20 | Sm$_2$S$_3$ |

This Table 3 shows that, in the absence of hydrogen, mixed (impure) sulfide films are obtained from this process.

TABLE 4

(comparison)

| Substrate Temp., °C. | $P_{H_2}$, torr | $P_{H_2S}$, torr | $P_{S_2}$, torr | Evap. Rate, Å/sec | Phases |
|---|---|---|---|---|---|
| 400 | $3.5 \times 10^{-4}$ | $3 \times 5 \times 10^{-5}$ | $1.4 \times 10^{-11}$ | — | SmS |
| 400 | $3.5 \times 10^{-4}$ | $3.5 \times 10^{-5}$ | $1.4 \times 10^{-11}$ | ~5 | SmS |
| 400 | $3.5 \times 10^{-4}$ | $3.5 \times 10^{-5}$ | $1.4 \times 10^{-11}$ | 3 | SmS |
| 400 | $2 \times 10^{-4}$ | $3.5 \times 10^{-5}$ | $3.8 \times 10^{-11}$ | 2 | SmS + Sm$_2$S$_3$ |
| 400 | $4.0 \times 10^{-4}$ | $3.5 \times 10^{-5}$ | $1.1 \times 10^{-11}$ | 5 | Sm + SmS |

Table 4 shows that the interrelation of the hydrogen and sulfur partial pressures are critical to forming pure samarium sulfide films. When the ratio of sulfur to hydrogen partial pressures falls much below 2.0, mixed films are obtained from this process.

TABLE 5

(comparison)

| Substrate Temp., °C. | $P_{H_2}$, torr | $P_{H_2S}$, torr | $P_{S_2}$, torr | Evap. Rate, Å/sec | Phases |
|---|---|---|---|---|---|
| 400 | $3 \times 5 \times 10^{-4}$ | $3.5 \times 10^{-5}$ | $1.4 \times 10^{-11}$ | 40 | Sm + SmS |
| 400 | $3.5 \times 10^{-4}$ | $3.5 \times 10^{-5}$ | $1.4 \times 10^{-11}$ | 20 | Sm + SmS |
| 400 | $3.5 \times 10^{-4}$ | $3.5 \times 10^{-5}$ | $1.4 \times 10^{-11}$ | 5 | SmS |

Since the method of the present invention is a non-equilibrium one, the rate at which Sm metal is evaporated affects the resulting product. The above Table 5 illustrates this effect.

The method of the present invention can be used to prepare thin films of alloyed $L_{1-x}R_xS$ where L is a rare earth lanthanide metal, R represents a rare earth metal provided that L & R are not te same, yttrium and scandium.

Thin films of $Sm_{1-x}Gd_xS$ where x=0.12, 0.15 and 0.17 were prepared. The conditions were the same as used to prepare SmS films (Table 1) except that samarium and gadolinium were evaporated simultaneously.

These conditions are shown below in Table 6.

TABLE 6

Conditions Used to Prepare $Sm_{1-x}Gd_xS$ Films

| x | Substrate Temp. | $P_{H_2}$ | $P_{H_2S}$ | $P_{S_2}$ | Evap. Rate, Å/sec Sm | Evap. Rate, Gd |
|---|---|---|---|---|---|---|
| 0.12 | 400 | $3.5 \times 10^{-4}$ | $3.5 \times 10^{-5}$ | $1.4 \times 10^{-11}$ | ~5 | ~0.6 |
| .15 | 400 | $3.5 \times 10^{-4}$ | $3.5 \times 10^{-5}$ | $1.4 \times 10^{-11}$ | 5 | ~0.8 |
| .17 | 400 | $3.5 \times 10^{-4}$ | $3.5 \times 10^{-5}$ | $1.4 \times 10^{-11}$ | 5 | ~0.9 |

In summary, successful application of the method of the present invention of fabricating thin films of rare earth metal chalcogenides or alloyed rare earth chalcogenides depends upon close control of conditions in a vacuum environment. The atmosphere is controlled through regulation of $H_2$ and $H_2S$ gases. The evaporation rate of the metal must be low enough such that depletion of the reactive gases does not occur. Finally, the substrate temperature should be high enough such that some crystallite growth occurs, but not so high as to approach thermodynamic equilibrium. If equilibrium is approached then $R_2S_3$ films will result rather than monosulfide films.

While many of the rare earth materials undergo a pressure induced "semiconductor to metal" transition, e.g., samarium undergoes such transition at a pressure of about 6.5 kilobars, a transition can also be induced by stress. Thus, simple polishing of the surface of a semiconducting rare earth chalcogenide can convert it to the metallic state. As such, certain of these chalcogenides can be readily used to make an optical memory disc. Typically, a chalcogenide layer over the substrate must be further protected by adding additional layers of various materials. Thus, various oxide films can be applied over the chalcogenide to protect it from mechanical or chemical defects.

Other modifications can be made without departing from the scope of this invention. Accordingly, the scope of protection is intended to be limited only by the scope of the appending claims.

What is claimed is:

1. A method for producing thin film chalcogenides of the rare earths comprising
   a. reacting a rare earth metal vapor with a non-oxygen containing chalcogenide gas in a hydrogen atmosphere at a pressure of about $1 \times 10^{-4}$ to about $9 \times 10^{-4}$ torr thereby forming a gaseous rare earth chalcogenide;
   b. depositing on a substrate said gaseous rare earth chalcogenide as a single phase solid thin film, said substrate being at a temperature of about 200° C. to about 400° C.

2. The method of claim 1 wherein said inert substrate is glass.

3. The method of claim 1 wherein said thin film is polycrystalline.

4. The method of claim 3 wherein the crystallites of said polycrystalline film are from about 200 angstrom to about 500 angstrom in size.

5. The method of claim 1 wherein said non-oxygen containing chalcogenide gas is hydrogen sulfide.

6. The method of claim 5 wherein the partial pressure of hydrogen sulfide is from about $1 \times 10^{-5}$ to about $9 \times 10^{-5}$ torr.

7. The method of claim 6 wherein said partial pressure of hydrogen sulfide is from about $2 \times 10^{-5}$ to about $4 \times 10^{-5}$ torr.

8. The method of claim 1 wherein said rare earth metal vapor is formed by evaporating a rare earth metal, the rate of evaporation being from about 1 A/sec. to about 40 A/sec.

9. A method for producing thin film rare earth metal-alloyed chalcogenides comprising
   a. reacting at least two rare earth metal vapors with a non-oxygen containing chalcogen gas in a hydrogen atmosphere at a pressure of about $1 \times 10^{-4}$ to about $9 \times 10^{-4}$ torr thereby forming a gaseous mixed rare earth metal chalcogenide
   b. depositing on a substrate heated to about 200° C. to about 400° C. said gaseous mixed rare earth metal chalcogenide.

10. The method of claim 9 wherein said inert substrate is glass.

11. The method of claim 9 wherein said thin film is polycrystalline.

12. The method of claim 11 wherein the crystallites of said polycrystalline film are from about 200 angstrom to about 500 angstrom in size.

13. The method of claim 9 wherein said non-oxygen containing chalcogenide gas is hydrogen sulfide.

14. The method of claim 13 wherein the partial pressure of hydrogen sulfide is from about $1 \times 10^{-5}$ to about $9 \times 10^{-5}$ torr.

15. The method of claim 14 wherein said partial pressure of hydrogen sulfide is from about $2 \times 10^{-5}$ to about $4 \times 10^{-5}$ torr.

16. The method of claim 9 wherein said rare earth metal vapor is formed by evaporating a rare earth metal, the rate of evaporation being from about 1 A/sec. to about 40 A/sec.

* * * * *